United States Patent

Mikawa et al.

Patent Number: 5,828,673
Date of Patent: Oct. 27, 1998

[54] LOGICAL CHECK APPARATUS AND METHOD FOR SEMICONDUCTOR CIRCUITS AND STORAGE MEDIUM STORING LOGICAL CHECK PROGRAM FOR SEMICONDUCTOR CIRCUITS

[75] Inventors: Yukiharu Mikawa; Takahiro Tani; Tadateru Kamimizo, all of Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 760,291

[22] Filed: Dec. 4, 1996

[30] Foreign Application Priority Data

Jun. 28, 1996 [JP] Japan ................................. 8-169767

[51] Int. Cl.$^6$ .......................... G11C 29/00; G06F 11/00; G06G 7/48
[52] U.S. Cl. ..................................... 371/21.1; 395/183.13; 364/578
[58] Field of Search ................................. 371/21.1, 27.4, 371/27.1; 395/183.09, 183.01, 183.13, 183.18, 185.07, 500; 364/578

[56] References Cited

U.S. PATENT DOCUMENTS

| | | | |
|---|---|---|---|
| 5,381,345 | 1/1995 | Takegami et al. | 364/578 |
| 5,446,674 | 8/1995 | Ikeda et al. | 364/578 |
| 5,490,095 | 2/1996 | Shimada et al. | 364/578 |
| 5,613,062 | 3/1997 | Hasebe et al. | 395/183.13 |

FOREIGN PATENT DOCUMENTS

| | | |
|---|---|---|
| 2294843 | 12/1990 | Japan . |
| 5-12368 | 1/1993 | Japan . |

*Primary Examiner*—Trinh L. Tu
*Attorney, Agent, or Firm*—Leydig, Voit & Mayer, Ltd.

[57] ABSTRACT

A semiconductor circuit logical check apparatus including a unit for extracting information about laser trimming fuse elements based on layout data and logic-circuit diagram data of a semiconductor circuit, a unit for generating a command sequence indicating that some of the laser trimming fuse elements are broken on the basis of the extracted laser trimming fuse element information, a unit for generating error bit memory cell array models from memory cell array models, and a unit for executing, on a semiconductor circuit model, logic simulation on the basis of the command sequence.

18 Claims, 8 Drawing Sheets

| Coordinate (X, Y) (um) | Instance & Nodename (Schematic) |
|---|---|
| −2198.000, −855.000 | Inst : X010836−X010581−R019101 |
|  | Node : VSS |
|  | Node : X010836−ND626 |
| −2198.000, −840.000 | Inst : X010836−X010528−R019101 |
|  | Node : VSS |
|  | Node : X010836−ND593 |

FIG. 6

```
#1000 force    top    temp. I836. ND626=1' b0;
#1000 force    top    temp. I836. ND593=1' b0;
       ......
#1234 release  top    temp. I836.ND626;
#1234 release  top    temp. I836.ND593;
```

LOGICAL CHECK APPARATUS AND METHOD FOR SEMICONDUCTOR CIRCUITS AND STORAGE MEDIUM STORING LOGICAL CHECK PROGRAM FOR SEMICONDUCTOR CIRCUITS

BACKGROUND OF THE INVENTION

1. Field of the Invention

The present invention relates to a logical check apparatus and method for laser trimming fuse elements for remedying error bits using a redundant circuit.

2. Description of the Related Art

Figure 7:
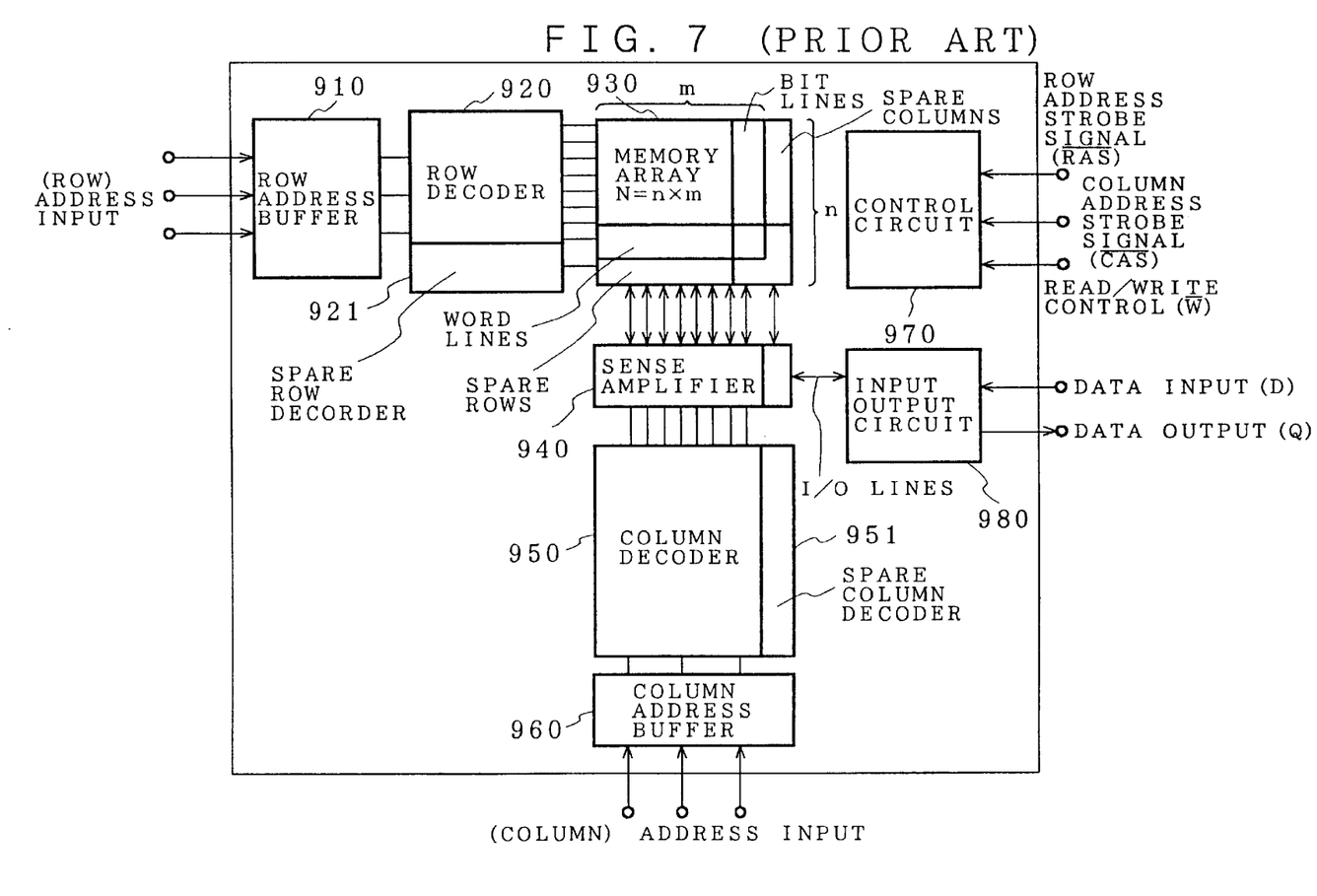
FIG. 7 is a block diagram showing a conventional DRAM with redundant circuits.

FIG. 7 is a block diagram showing the arrangement of a conventional DRAM including redundant circuits. In this figure, the reference numeral 910 designates a row address buffer, reference numeral 920 designates a row decoder, reference numeral 921 designates a spare row decoder, reference numeral 930 designates a memory array including n×m memory area plus spare rows and spare columns, reference numeral 940 designates a sense amplifier, reference numeral 950 designates a column decoder, reference numeral 951 designates a spare column decoder, reference numeral 960 designates a column address buffer, reference numeral 970 designates a control circuit and reference numeral 980 designates an input output circuit for inputting and outputting data.

Figure 8:
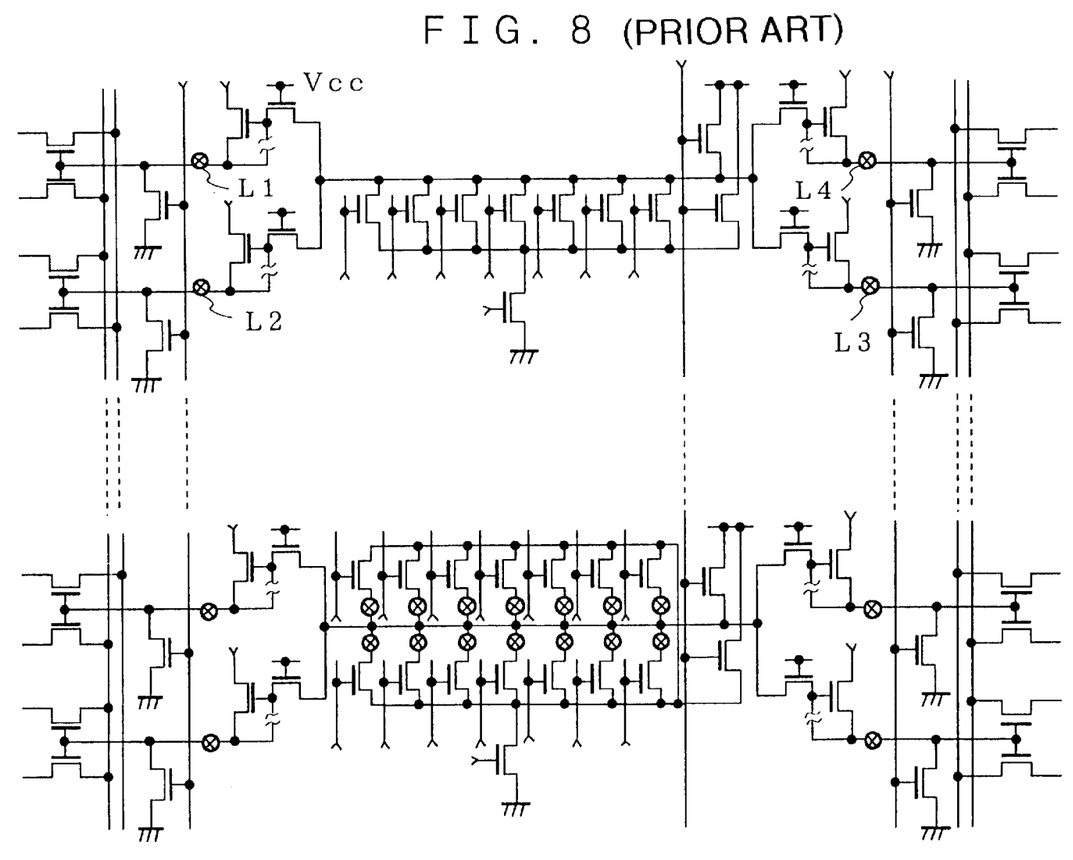
FIG. 8 is a circuit diagram showing a configuration in which laser trimming fuse elements provided on the output side of the select lines are laser blown, and a select signal selects error memory cells.

The spare rows and columns in the memory array 930 are provided in advance for replacing error memory cells due to defects with the spare memory cells, column by column or row by row. A program is implemented in the internal circuit of the memory device after the wafer process has been completed, which program switches an address signal for selecting an error memory cell to a spare address. The program must first inactivate the row select line (or the column select line) of the memory cell when the address selecting the error bit is input. One technique for achieving this is shown in FIG. 8, in which laser trimming fuse elements L1–L4 provided on the output side of the select line are laser blown so that the select line selects the error memory cell. Then, the spare row decoder 921 and spare column decoder 951 select a memory cell in the spare rows and spare columns. Thus remedying error bits with a laser trimming device, it is possible to improve the yield of the memory fabrication by using the redundant circuit.

Figure 9:
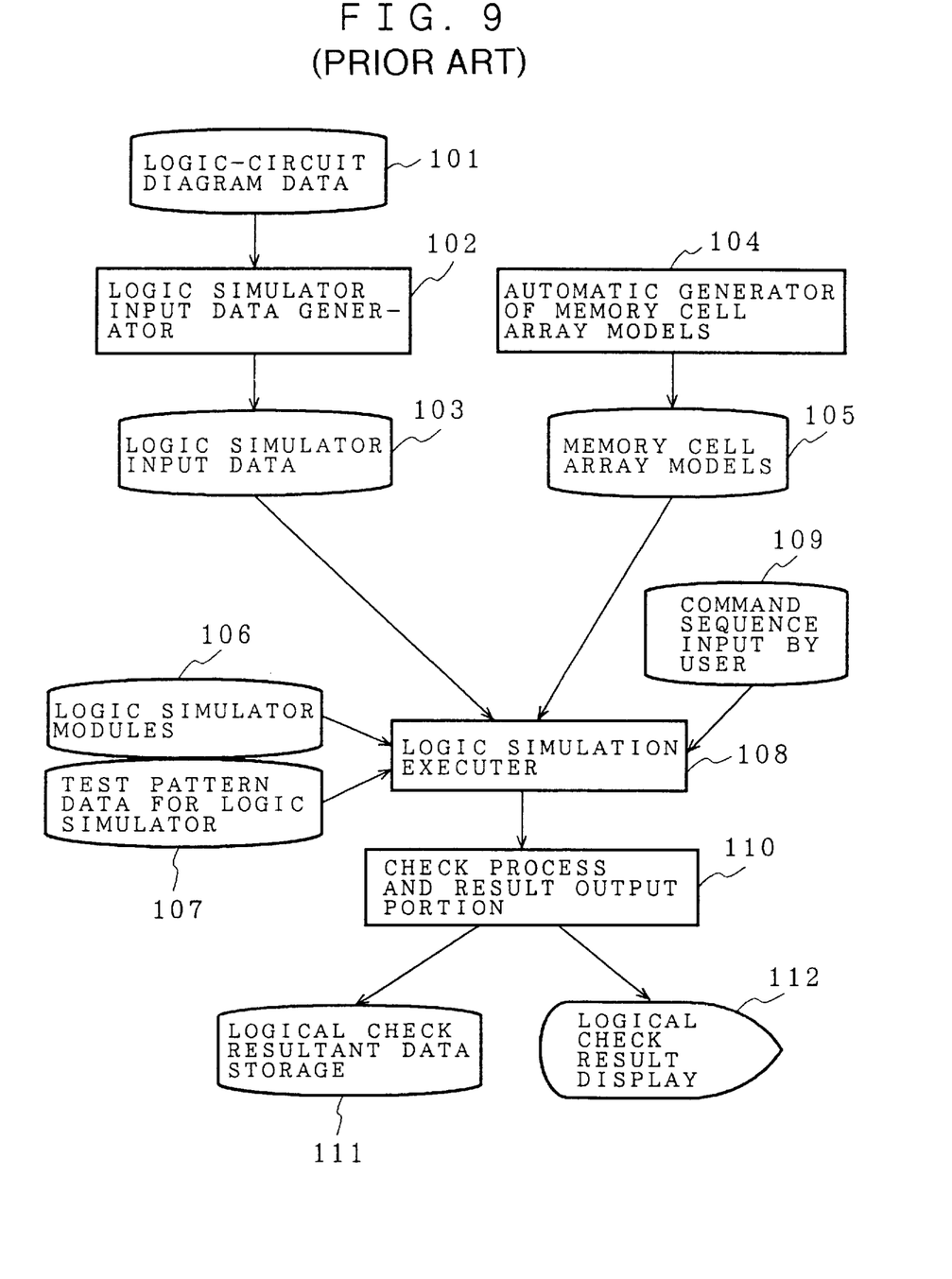
FIG. 9 is a block diagram showing a conventional logical check apparatus for the laser trimming operation.

FIG. 9 is a block diagram showing the arrangement of a conventional logical check apparatus for the laser trimming operation. In this figure, the reference numeral 101 designates logic-circuit diagram data of an LSI device to be designed. Reference numeral 102 designates a logic simulator input data generator which extracts circuit connection information or the like from the logic-circuit diagram data 101, and outputs the information in the grammar that the logic simulator can interpret. Reference numeral 103 designates logic simulator input data generated by the logic simulator input data generator 102. Reference numeral 104 designates an automatic generator of memory cell array models for automatically generating operational description of memory cell arrays in accordance with the user specification. Reference numeral 105 designates memory cell array models generated by the automatic generator 104 of memory cell array models, or memory cell array models prepared manually which perform operation equivalent to the memory cell array models generated by the automatic generator 104. Reference numeral 106 designates net list data (which is referred to as logic simulator modules below) consisting of a set of logic circuit models equivalent to elements placed in the logic-circuit diagram. Reference numeral 107 designates test pattern data for the logic simulator, which defines input signals or the like applied to the logic circuit models which are modeled on the logic simulation data such that they are equivalent to the logic-circuit diagram data 101. Reference numeral 108 designates a logic simulation executer for carrying out the logic simulation based on the memory cell array models 105, logic simulator modules 106 and test pattern data 107 for the logic simulator. Reference numeral 109 designates a command sequence input by a user for controlling the logic simulation executer 108. Reference numeral 110 designates a check process and result output portion for outputting the process and results of the check of the logic simulation carried out by the logic simulation executer 108. Reference numeral 111 designates a logical check resultant data storage for storing the resultant data of the logical check output from the logic simulation executer 108. Reference numeral 112 is a logical check result display for displaying the logical check results output from the logic simulation executer 108.

A designer of an LSI operates the logic simulator input data generator 102 for the logic-circuit diagram data 101, thereby obtaining the logic simulator input data 103. Subsequently, the designer obtains desired memory cell array models in accordance with a specification by using the automatic generator 104 of memory cell array models, or manually prepares memory cell array models corresponding thereto in the operation using an editor. The logic simulator input data 103, memory cell array models 105, logic simulator modules 106 and test pattern data 107 for the logic simulator are input to the logic simulation executer 108, so that the logic simulation of the LSI to be designed is executed using these data. The results of the logical check by the logic simulation are fed from the check process and result output portion 110 to the logical check resultant data storage 111 to be stored, and are displayed on the logical check result display 112, thus entering the waiting mode for the command input from the user.

Next, the designer, assuming that the bit in a given memory cell which has been modeled on the logic simulator is an error bit, selects from the logic-circuit diagram data 101 particular laser trimming fuse elements which activate the redundant circuits for remedying the error bit. Subsequently, the designer input a logic simulator control command and a simulation execution command to the logic simulation executer 108, these commands having the same effect on the laser trimming fuse elements which have been modeled on the logic simulation executer 108, as breaking the laser trimming fuse elements on the actual device. Thus, the logic simulation executer 108 executes the logic simulation. The simulation execution command decides whether the simulation results should be output to only the logical check resultant data storage 111, or only the logical check result display 112, or both the logical check resultant data storage 111 and logical check result display 112. The logic simulation executer 108 carries out the logic simulation in accordance with the command sequence 109 input by the user, and outputs the logical check results through the check process and result output portion 110 to one of the logical check resultant data storage 111 and logical check result display 112, or to both of them. When the logical check results are output to the logical check resultant data storage 111, the logical check results are displayed on the display screen.

Then, the designer examines the state held by the memory cell modeled by the logic simulation executer 108 by using the data stored in the logical check resultant data storage 111 or displayed on the logical check result display 112. Specifically, the designer confirms whether the redundant circuits for remedying the assumed error bit which has been arbitrarily selected are activated. He confirms by inspection whether the state held by the normally operating memory cell is as expected or not. If it is confirmed that the redundant circuits operate appropriately as expected as a memory cell, the designer examines the relationships between other laser trimming fuse elements and redundant circuits. If the redundant circuits do not operate normally as a memory cell, the designer examines calculation formulae or the like for obtaining the coordinate values of the laser trimming fuse elements, which provide the basis for selecting the logic-circuit diagram and the particular laser trimming fuse elements, so that the designer can find and deal with the causes of the abnormal operation as a memory cell. The above-mentioned steps are carried out with the entire laser trimming fuse elements and the redundant circuits for remedying error bits.

The conventional logical check apparatus for laser trimming operation is configured as described above. Accordingly, the apparatus has a problem in that it can achieve only the logical check (referred to as the logical check of the laser trimming operation below) of the relationships between the laser trimming fuse elements the designer selected and the redundant circuits for remedying the error bit, which are activated by blowing the fuses.

This results in the following problems:

(1) It takes a long time to complete the logical check of the laser trimming operation for the entire laser trimming fuse elements and the redundant circuits in the logic-circuit diagram. This is because the logic simulation must be carried out for each combination of the laser trimming fuse elements and the redundant circuits for remedying each error bit.

(2) When assuming that the bit in a memory cell modeled on the logic simulator as an error bit, a mistake is likely to take place in selecting particular laser trimming fuse elements for activating the redundant circuits for remedying the error bit.

(3) If there are some mistakes in the description of the calculating formulae for obtaining the coordinate values of the laser trimming fuse elements, wrong laser trimming fuse elements will be selected, because the calculating formulae provide the basis for selecting the particular laser trimming fuse elements.

(4) It requires considerable labor to carry out the inspection for confirming the information about the error bit and the redundant circuits for remedying the error bit among the enormous amount of text data representing the states held by the memory cell modeled on the logic simulation.

SUMMARY OF THE INVENTION

The present invention solves the foregoing problems, and its object is to provide a logical check apparatus and method of a laser trimming operation which can achieve overall, fast detection of errors in the laser trimming operation, such as a logical error in selecting laser trimming fuse elements, a mistake in the logical design of an error bit remedying circuit for switching to redundant circuits for remedying an error bit, and a mistake in description of the calculating formulae for obtaining the coordinate values of the laser trimming fuse elements.

To accomplish the foregoing object, the semiconductor circuit logical check apparatus in accordance with the present invention comprises: laser trimming fuse element information extraction means for extracting information about laser trimming fuse elements from layout pattern data of a semiconductor circuit and logic-circuit diagram data of the semiconductor circuit; laser trimming operation command sequence generating means for generating a laser trimming operation command sequence on logic simulation indicating that particular one or more of the laser trimming fuse elements are broken in the semiconductor circuit on the basis of the laser trimming fuse element information extracted by the laser trimming fuse element information extraction means; error bit memory cell array generating means for generating, from memory cell array models associated with a memory cell array which is assumed to be operating normally, error bit memory cell array models representing that an error bit is included in the memory cell array; and logic simulation executing means for executing logic simulation on models of the semiconductor circuit including the error bit memory cell array models on the basis of the laser trimming operation command sequence. Since the apparatus is arranged such that the logic simulation is executed in the case where the laser trimming fuse elements are broken whose information is extracted from the layout pattern data and the logic-circuit diagram data of the semiconductor circuit including the laser trimming fuse elements and the memory cell array, a single logical check operation can fulfill the logical check for the operation of the entire laser trimming fuse elements of a desired semiconductor circuit, thereby enabling a fast logical check.

The semiconductor circuit logical check apparatus in accordance with the present invention is arranged such that it further comprises laser trimming fuse element coordinate check means for checking coordinates of the laser trimming fuse elements using the layout pattern data of the semiconductor circuit and a control command file for laser trimming fuse element coordinate check, wherein the laser trimming fuse element information extraction means extracts information about laser trimming fuse elements whose coordinates obtained from the control command coincide with coordinates of the layout pattern data. Since it is arranged such that the information is extracted about laser trimming fuse elements whose coordinates obtained from the control command coincide with coordinates of the layout pattern data, more efficient logic simulation of the laser trimming fuse elements can be achieved.

The semiconductor circuit logical check apparatus in accordance with the present invention is arranged such that it further comprises input means for inputting instructions from a user, wherein the laser trimming operation command sequence generating means generates a laser trimming operation command sequence only for information about laser trimming fuse elements selected by the user through the input means from the laser trimming fuse element information extracted by the laser trimming fuse element information extraction means. Since the laser trimming operation command sequence generating means is arranged such that it generates a laser trimming operation command sequence only for information about laser trimming fuse elements selected by the user through the input means from the laser trimming fuse element information extracted by the laser trimming fuse element information extraction means, it provides an advantage that more efficient logical check can be achieved.

The semiconductor circuit logical check apparatus in accordance with the present invention is arranged such that it further comprises input means for inputting instructions from a user, wherein the logic simulation executing means performs logic simulation on a portion selected by the user through the input means from the models of the semiconductor circuit including the error bit memory cell array models. Since the logic simulation executing means is arranged such that it performs logic simulation on a portion selected by the user through the input means from the models of the semiconductor circuit including the error bit memory cell array models, it provides an advantage that more efficient logical check can be achieved.

The semiconductor circuit logical check apparatus in accordance with the present invention is arranged such that the output means displays on a screen laser trimming fuse elements associated with laser trimming operation error and signal lines connected to the laser trimming fuse elements in a manner distinguishable from the remaining elements. Since the output means displays on a screen laser trimming fuse elements associated with laser trimming operation error and signal lines connected to the laser trimming fuse elements in a manner distinguishable from the remaining elements, it provides an advantage that laser trimming fuse elements associated with faulty operation can be easily identified.

DETAILED DESCRIPTION OF THE PREFERRED EMBODIMENTS

EMBODIMENT 1

Figure 1:
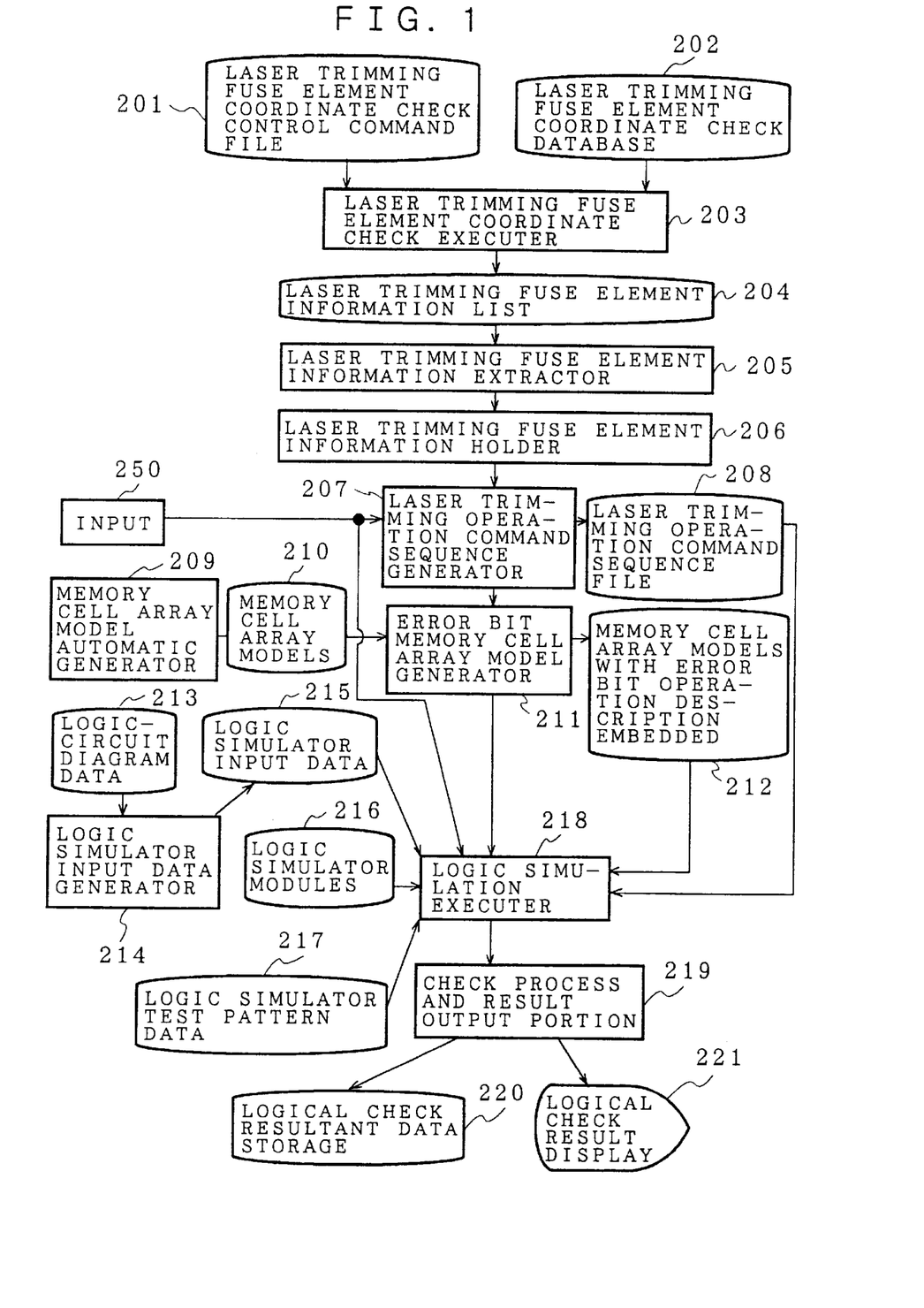
FIG. 1 is a block diagram showing the configuration of a logical check apparatus for semiconductor circuits in accordance with an embodiment of the present invention.

FIG. 1 is a block diagram showing the configuration of a logical check apparatus for semiconductor circuits in accordance with embodiment 1 of the present invention. In this figure, the reference numeral 201 designates a laser trimming fuse element coordinate check control command file for checking the positions of laser trimming fuse elements. Reference numeral 202 designates a laser trimming fuse element coordinate check database generated by layout check which makes a comparative check of a coincidence of a layout pattern data with the device information and circuit connection information of logic-circuit diagram data. Reference numeral 203 designates a laser trimming fuse element coordinate check executer for checking the coordinates of the laser trimming fuse elements by using the input data from the laser trimming fuse element coordinate check control command file 201 and the laser trimming fuse element coordinate check database 202. Reference numeral 204 designates a laser trimming fuse element information list about laser trimming fuse elements whose coordinates output from the laser trimming fuse element coordinate check executer 203 coincide with those on the layout pattern data. The coordinates of the laser trimming fuse elements output from the laser trimming fuse element coordinate check executer 203 are calculated from calculation formulae of the laser trimming fuse element coordinate check control command file 201.

The reference numeral 205 designates a laser trimming fuse element information extractor for extracting the entire laser trimming fuse element information from the laser trimming fuse element information list 204. Reference numeral 206 designates a laser trimming fuse element information holder for holding information extracted by the laser trimming fuse element information extractor 205. Reference numeral 207 designates a laser trimming operation command sequence generator for generating logic simulator control command sequence for achieving on the logic simulator the same effect as breaking the laser trimming fuse elements on the layout pattern data in accordance with the information held in the laser trimming fuse element information holder 206. Reference numeral 208 designates a laser trimming operation command sequence file generated by the laser trimming operation command sequence generator 207. Reference numeral 209 designates memory cell array models automatic generator for automatically generating memory cell array operation description in accordance with the specification of a user. Reference numeral 210 designates memory cell array models generated by the memory cell array model automatic generator 209 or memory cell array models prepared manually so that it achieves equivalent operation to that generated by the automatic generator 209. Reference numeral 211 designates an error bit memory cell array model generator for generating error bit memory cell array models which are produced by embedding the description of the error bit operation into the memory cell array models 210. Reference numeral and 212 designates memory cell array models with the error bit operation description embedded, which are generated by the error bit memory cell array model generator 211.

Furthermore, the reference numeral 213 designates the logic-circuit diagram data of the LSI device to be designed. Reference numeral 214 designates a logic simulator input data generator for extracting circuit connection information and the like from the logic-circuit diagram data 213, and for outputting the information in the grammar the logic simulator can interpret. Reference numeral 216 designates net list data (which is referred to as logic simulator modules below) consisting of the logic circuit model group equivalent to the elements placed on the logic-circuit diagram 213. Reference numeral 217 designates a logic simulator test pattern data which defines input signals applied to the logic circuit models modeled on the logic simulator so that the models matches the logic-circuit diagram data 213.

The reference numeral 218 designates a logic simulation executer for carrying out the logic simulation on the basis of the logic simulator input data 215, the error bit memory cell array models 212 into which the description of the error bit operation is embedded, the logic simulator modules 216, the logic simulator test pattern data 217 and the laser trimming operation command sequence file 208. Reference numeral 219 designates a check process and result output portion for outputting the process and results of the check by the logic simulation performed by the logic simulation executer 218; 220 designates a logical check resultant data storage for storing the logical check resultant data output from the logic simulation executer 218. Reference numeral 221 designates a logical check result display for displaying the results of the logical check output from the logic simulation executer 218. Reference numeral 250 designates an input portion for inputting instructions of the user.

Figure 2:
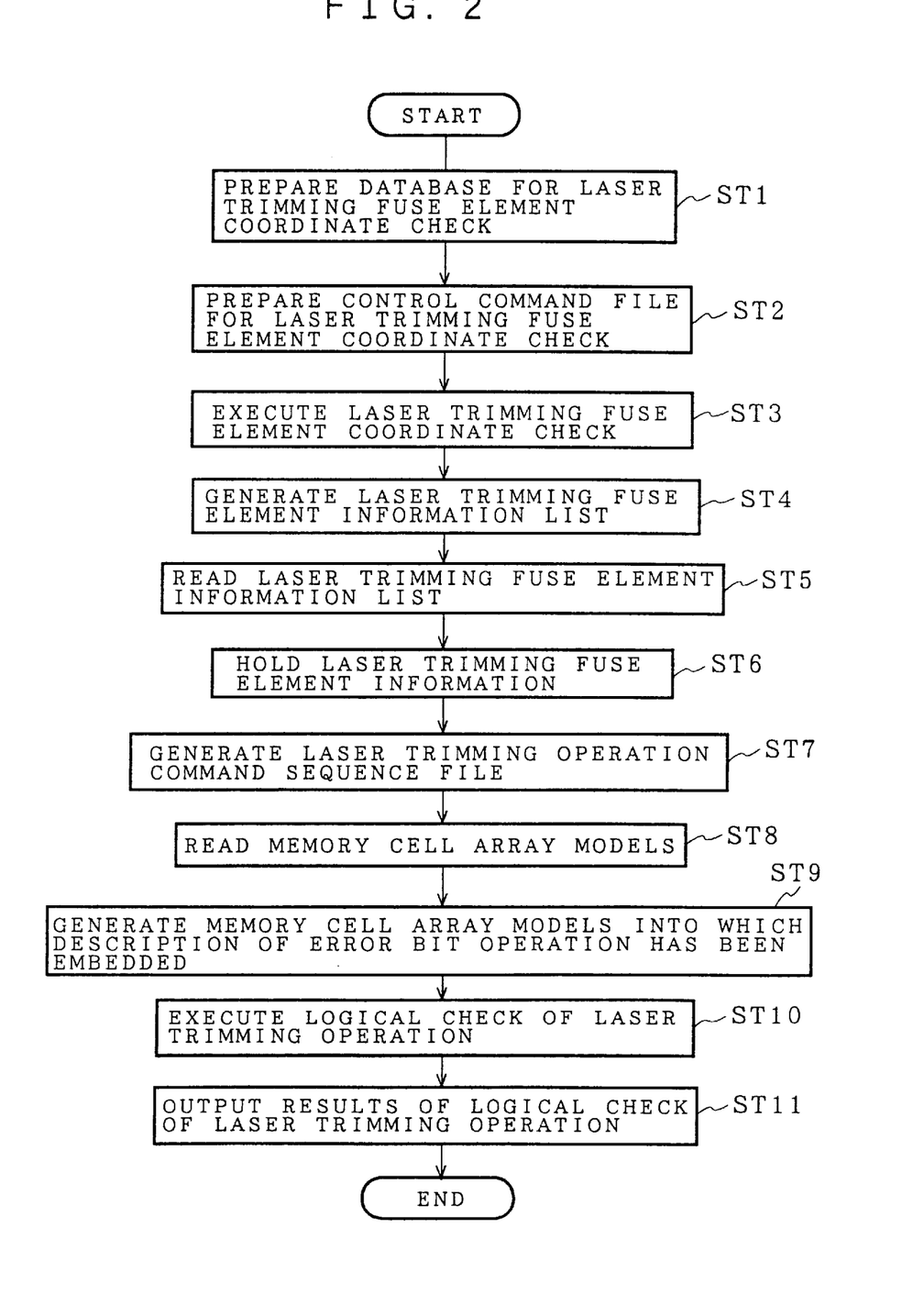
FIG. 2 is a flowchart showing the operation of the logical check apparatus for semiconductor circuits with the configuration as shown in FIG. 1.

FIG. 2 is a flowchart illustrating the operation of the semiconductor circuit logical check apparatus with the above-described configuration.

Figure 5:
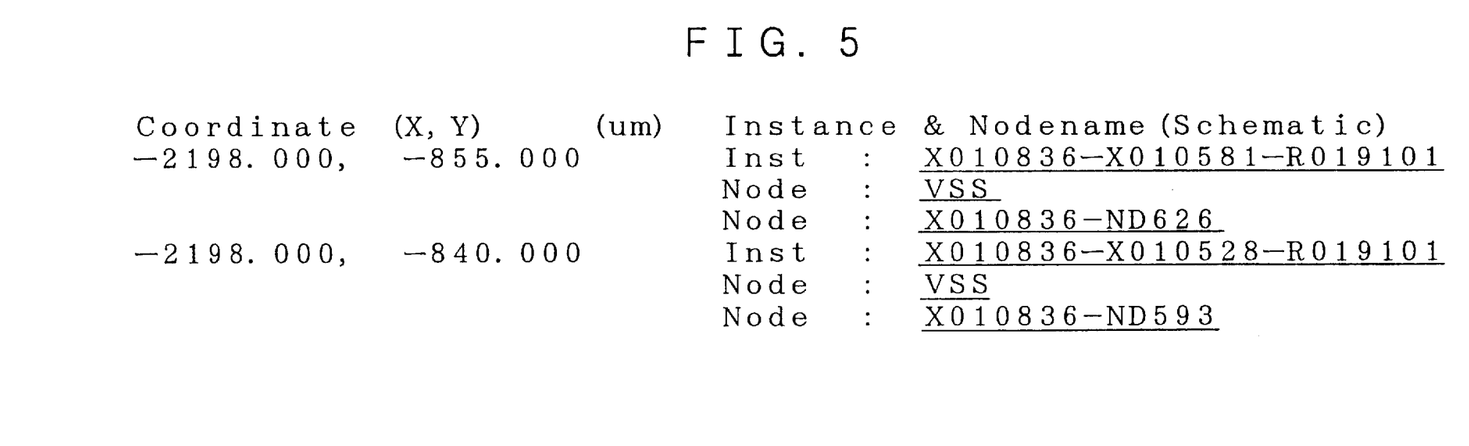
FIG. 5 is a view illustrating a laser trimming fuse element information list.

First, the laser trimming fuse element coordinate check database 202 is generated (at step ST1) by a layout check apparatus or the like which makes comparative check of the layout pattern data with the device information and circuit connection information or the like of the logic-circuit diagram data 213. Then, the laser trimming fuse element coordinate check control command file 201 is generated (at step ST2) using an editor. Subsequently, the laser trimming fuse element coordinate check executer 203 checks the coordinates of the laser trimming fuse elements (at step ST3) on the basis of the laser trimming fuse element coordinate check control command file 201 and the data stored in the laser trimming fuse element coordinate check database 202, and outputs the laser trimming fuse element information list 204 based on the data obtained by the checking (at step ST4). FIG. 5 is a view illustrating the laser trimming fuse element information list 204. As shown in this figure, the laser trimming fuse element information list 204 includes coordinate data (A) for checking the coordinates of the laser trimming fuse elements, and element connection information (B) such as element identification numbers and net names connected.

Next, the laser trimming fuse element information extractor 205 reads the laser trimming fuse element information list 204 (at step ST5), extracts information about the laser trimming fuse elements such as the element identification numbers and net names connected, and holds the information in the laser trimming fuse element information holder 206 (at step ST6). That is, the data underlined in FIG. 5 are extracted. Among the underlined data in FIG. 5, "X010836-X010581-R019101" describes the circuit diagram information in a hierarchical manner, and the "Node"s associated therewith indicate the terminals to which the laser trimming fuse element is connected. In this example, one terminal of the first laser trimming fuse element is connected to the voltage VSS, and the other terminal is connected to a node indicated by the connection information of ND626 in the circuit denoted by X010836.

Figure 6:
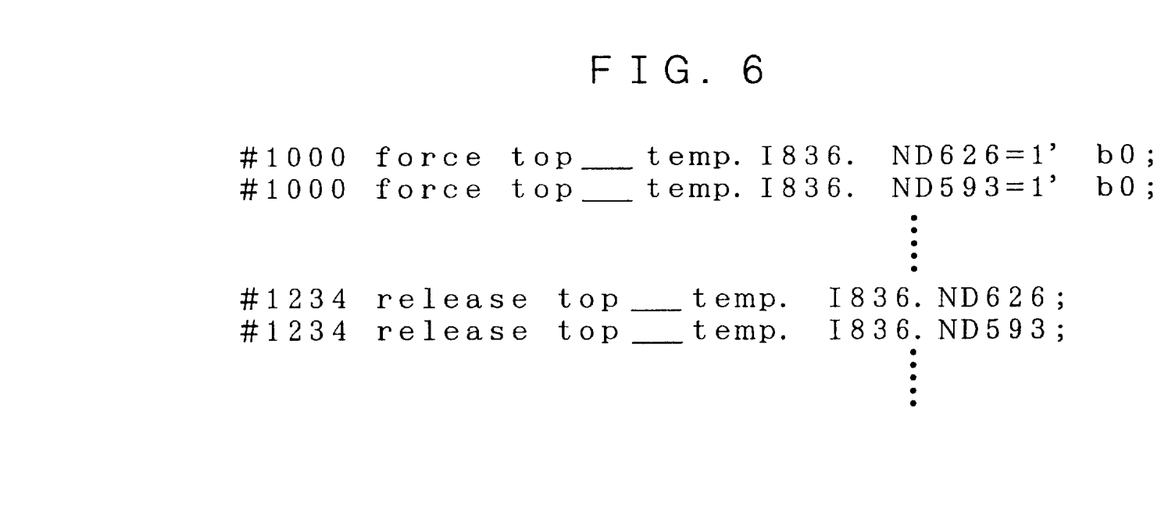
FIG. 6 is a view illustrating a laser trimming operation command sequence file.

Subsequently, the laser trimming operation command sequence generator 207 generates the laser trimming operation command sequence file 208 (at step ST7) for implementing on the logic simulator the same effect as breaking the laser trimming fuse elements on the actual device in accordance with the information held in the laser trimming fuse element information holder 206. In other words, it generates the laser trimming operation command sequence file 208 for the entire laser trimming fuse elements stored in the laser trimming fuse element information holder 206. FIG. 6 illustrates the laser trimming operation command sequence file 208. The numerals following the "#" mark like #1000 designate execution time, and "top_temp. I836" is a code representing a circuit. In addition, "ND626" is connection information designating a particular node in the circuit top_temp. I836. Thus, the top line means that the output of the node indicated by the connection information ND626 is fixed at "0" in the circuit represented by top_temp. I836. Specifically, this means that the laser trimming fuse element is broken on the logic simulator. The description following #1234 means that the command indicating the break of the laser trimming fuse element is relinquished. That is, it represents the command indicating reconnection of the laser trimming fuse element.

Next, the error bit memory cell array model generator 211 reads the memory cell array models 210 (at step ST8), and generates the memory cell array models 212 into which the description of the error bit operation is embedded (at step ST9).

After that, the logic simulation executer 218 carries out the logical check of the laser trimming operation (at step ST10) by executing the logic simulation using the laser trimming operation command sequence file 208, the memory cell array models 212 into which the description of the error bit operation is embedded, the logic simulator input data 215, the logic simulator modules 216 and the logic simulator test pattern data 217.

Subsequently, the check process and result output portion 219 either stores the data associated with the errors of the laser trimming operation into the logical check resultant data storage 220, or displays the data on the logical check result display 221. The data include logical mistakes in selecting the laser trimming fuse elements, mistakes in the logic design of an error bit remedy circuit for switching to redundant circuits for remedying the error bits, and mistakes in description of the calculation formulae for obtaining the coordinate values of the laser trimming fuse elements, which mistakes are detected by performing the logical check of the laser trimming operation.

Thus, the embodiment 1 generates laser trimming operation command sequence file 208 for implementing the same effect as breaking the laser trimming fuse elements on the actual device in accordance with the laser trimming fuse element information list 204 generated by the coordinate check of the laser trimming fuse elements. Then, the error bit memory cell array models 212, into which the description of the error bit operation of the memory cell array model is embedded, are generated on the basis of the memory cell array models 210 in accordance with the user specification. Subsequently, the logic simulation is carried out by inputting to the logic simulator the laser trimming operation command sequence file 208 and the error bit memory cell array models 212 as the logic simulation data. This makes possible the overall detection of the failures leading to the laser trimming operation errors.

Figure 3:
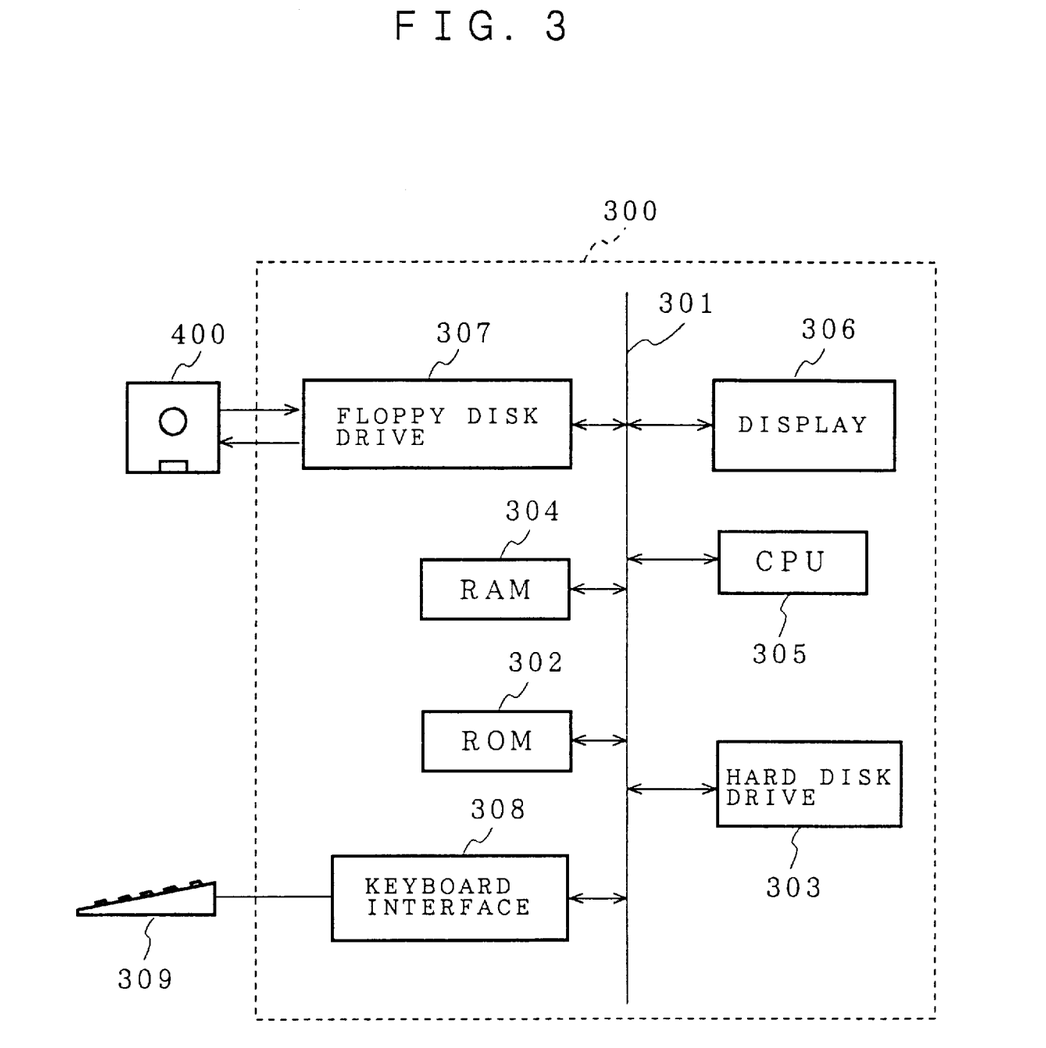
FIG. 3 is a schematic block diagram showing the configuration of a computer when the logical check apparatus for semiconductor circuits of FIG. 1 is implemented with the computer in connection with software operating thereon.

The logical check apparatus of the laser trimming fuse element in accordance with the embodiment 1 can be arranged totally by hardware, or by a computer in connection with software operating on the computer. FIG. 3 is a block diagram showing the schematic configuration of the computer using software operating thereon. In this figure, the reference numeral 300 designates a general purpose computer, 301 designates a bus, 302 designates a ROM connected to the bus 301 for storing programs and the like for carrying out basic operations, 303 designates a hard disk drive for storing the programs and others, 304 designates a RAM for storing software to be executed and used as work area, 305 designates a CPU for sequentially executes the program stored in the RAM 304, 306 designates a display for displaying data and the like on its screen, 307 designates a floppy disk drive for writing or reading data to or from a floppy disk 400, and 308 designates a keyboard interface for carrying out input processing of a keyboard 309.

The floppy disk 400, on which the software program for performing the above-described operation is written, is inserted into the floppy disk drive 307 connected to the general purpose computer 300. The software program written on the floppy disk 400 is transferred to be stored in the hard disk drive 303 under the control of the CPU 305. When the software program is executed, the software program stored in the hard disk drive 303 is transferred to the RAM 304 to be stored, and then the software program is executed by the CPU 305, thereby implementing the apparatus described in connection with FIGS. 1 and 2. The logical check result display 221 displays the logical check results on the screen of the display unit 306. In addition, the input portion 250 inputs the user instructions through the keyboard 309 and the keyboard interface 308.

Although the floppy disk 400 is employed in the above description for storing the software program to be transferred to the internal memory of the general purpose computer 300, any computer readable storage media can be used such as a CD-ROM, mini-disk, memory card, magnetic tape.

EMBODIMENT 2

Although the laser trimming operation command sequence generator 207 generates laser trimming operation command sequence for the entire information about the laser trimming fuse elements held in the laser trimming fuse element information holder 206 in the embodiment 1, the logical check of the laser trimming operation may be carried out for only one or more laser trimming fuse elements selected through the input portion 250. In this case, the laser trimming operation command sequence generator 207 generates the laser trimming operation command sequence for only the selected one or more laser trimming fuse elements, and the logical check of the laser trimming operation is carried out on the basis of the generated command sequence. In the case where the user selects particular laser trimming fuse elements, but target redundant circuits cannot be selected without breaking additional laser trimming fuse elements, the apparatus operates to display these additional laser trimming fuse elements as needed in the embodiment 2.

Thus, the embodiment 2 can improve the check efficiency by reducing the number of circuits subjected to the logical check of the laser trimming operation by selecting in advance the laser trimming fuse elements on which the logical check of the laser trimming operation is performed.

EMBODIMENT 3

Although the logic simulation executer 218 carries out the logical check of the laser trimming operation for the entire memory cell array models 210 and logic simulator modules 216 which are input in the embodiments 1 and 2, it may carry out the logical check for only memory cell array models 210 or logic simulator modules 216 corresponding to one or more logic-circuit diagrams which are selected by the user through the input portion 250. In this case, the logical check of the laser trimming operation is performed only for particular models in the memory cell array models 210 or logic simulator modules 216 corresponding to one or more logic-circuit diagrams which are selected.

Thus, the embodiment 3 is characterized in that the number of circuits is reduced which undergo the logical check of the laser trimming operation by preselecting the memory cell array models 210 and logic simulator modules 216 to be subjected to the logical check of the laser trimming operation, thereby further increasing the check efficiency.

EMBODIMENT 4

In the embodiments 1–3, the check process and result output portion 219 either stores in the logical check resultant data storage 220 or displays on the logical check result display 221 the information about the laser trimming operation errors. The embodiment 4 is arranged such that the check process and result output portion 219 transfers the information about the laser trimming fuse elements which cause errors, to the logical check result display 221 together with the logic circuit diagram to be displayed on its screen.

The check process and result output portion 219 retrieves the identification numbers of the laser trimming fuse elements from the laser trimming fuse element information list 204 using the information about the laser trimming fuse elements associated with the laser trimming operation errors, retrieves the information about the signal lines connected to the laser trimming fuse elements from the logic-circuit diagram data 213, and generates the logic-circuit diagram data 213 of the laser trimming fuse elements and the signal lines to be displayed on the logical check result display 221. Thus, the laser trimming fuse elements associated with the operation errors are distinguished from the remaining laser trimming fuse elements. Here, the operation error of the laser trimming fuse elements refers a case in which the bits of the corresponding memory cell array cannot be remedied by the redundant circuits even if the command instructing the break of the laser trimming fuse elements is input.

Figure 4:
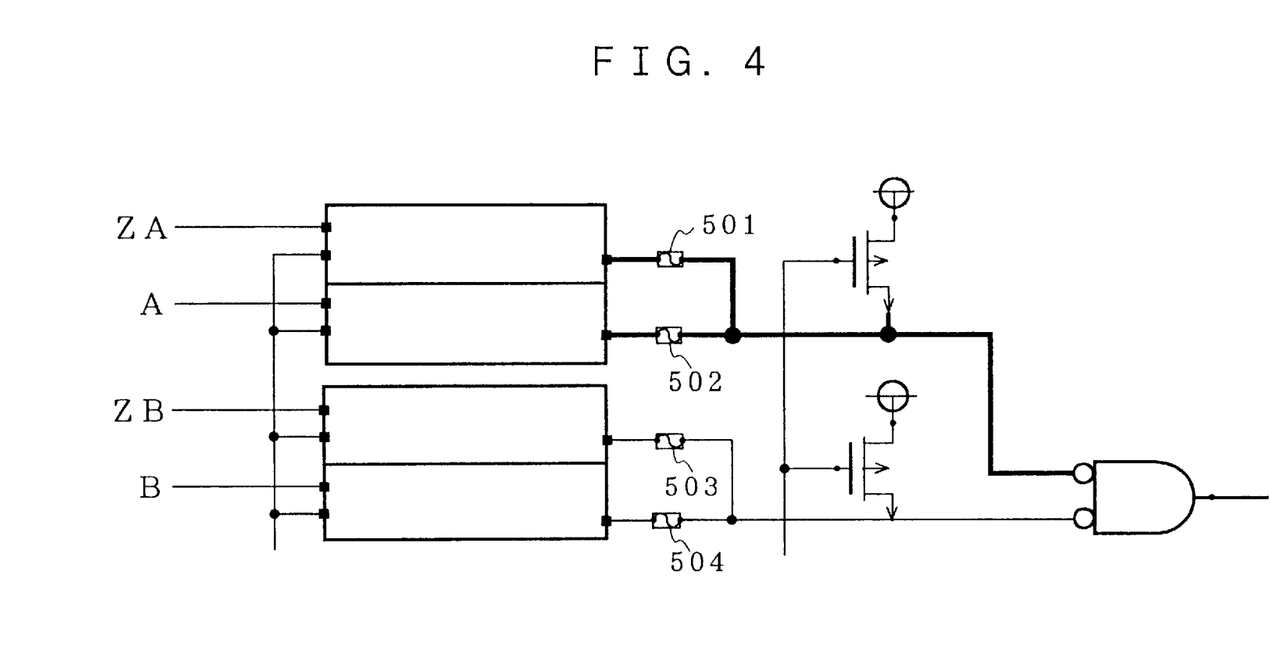
FIG. 4 is a diagram illustrating an example of an image displayed in embodiment 4 of the present invention.

FIG. 4 illustrates an example of an image displayed on the screen in the embodiment 4. As shown in FIG. 4, faulty laser trimming fuse elements 501 and 502 in the logic-circuit diagram and the signal lines connected thereto are distinguished on the display from the remaining laser trimming fuse elements 503 and 504 and the signal lines by colors or line types.

This makes it possible to improve the efficiency of analysis of the error laser trimming operation by thus representing the laser trimming fuse elements involved in the faulty laser trimming operation and the signal lines connected thereto in the logic-circuit diagram when displaying the information about the laser trimming operation error.

What is claimed is:

1. A semiconductor circuit logical check apparatus for performing logical checks of a semiconductor circuit including laser trimming fuse elements and a memory cell array, said semiconductor circuit logical check apparatus comprising:

laser trimming fuse element information extraction means for extracting information about said laser trimming fuse elements from a layout pattern data of said semiconductor circuit and logic-circuit diagram data of said semiconductor circuit;

laser trimming operation command sequence generating means for generating a laser trimming operation command sequence indicating that one or more of said laser trimming fuse elements are broken in said semiconductor circuit on the basis of said laser trimming fuse element information extracted by said laser trimming fuse element information extraction means;

error bit memory cell array generating means for generating, from memory cell array models associated with said memory cell array, error bit memory cell array models representing that an error bit is included in said memory cell array;

logic simulation executing means for executing logic simulation on models of said semiconductor circuit including said error bit memory cell array models on the basis of said laser trimming operation command sequence; and output means for outputting results of said logic simulation.

2. The semiconductor circuit logical check apparatus as claimed in claim 1, further comprising laser trimming fuse element coordinate check means for checking coordinates of said laser trimming fuse elements using said layout pattern data of said semiconductor circuit and a control command file for laser trimming fuse element coordinate check, wherein said laser trimming fuse element information extraction means extracts information about laser trimming fuse elements whose coordinates obtained from said control command coincide with coordinates of said layout pattern data.

3. The semiconductor circuit logical check apparatus as claimed in claim 2, further comprising input means for inputting instructions from a user, wherein said laser trimming operation command sequence generating means generates a laser trimming operation command sequence only for information about laser trimming fuse elements selected by the user through said input means from said laser trimming fuse element information extracted by said laser trimming fuse element information extraction means.

4. The semiconductor circuit logical check apparatus as claimed in claim 3, further comprising input means for inputting instructions from a user, wherein said logic simulation executing means performs logic simulation on a portion selected by the user through said input means from said models of said semiconductor circuit including said error bit memory cell array models.

5. The semiconductor circuit logical check apparatus as claimed in claim 4, wherein said output means displays on a screen laser trimming fuse elements associated with laser trimming operation error and signal lines connected to said laser trimming fuse elements in a manner distinguishable from the remaining elements.

6. The semiconductor circuit logical check apparatus as claimed in claim 3, wherein said output means displays on a screen laser trimming fuse elements associated with laser trimming operation error and signal lines connected to said laser trimming fuse elements in a manner distinguishable from the remaining elements.

7. The semiconductor circuit logical check apparatus as claimed in claim 2, further comprising input means for inputting instructions from a user, wherein said logic simulation executing means performs logic simulation on a portion selected by the user through said input means from said models of said semiconductor circuit including said error bit memory cell array models.

8. The semiconductor circuit logical check apparatus as claimed in claim 7, wherein said output means displays on a screen laser trimming fuse elements associated with laser trimming operation error and signal lines connected to said laser trimming fuse elements in a manner distinguishable from the remaining elements.

9. The semiconductor circuit logical check apparatus as claimed in claim 2, wherein said output means displays on a screen laser trimming fuse elements associated with laser trimming operation error and signal lines connected to said laser trimming fuse elements in a manner distinguishable from the remaining elements.

10. The semiconductor circuit logical check apparatus as claimed in claim 1, further comprising input means for inputting instructions from a user, wherein said laser trimming operation command sequence generating means generates a laser trimming operation command sequence only for information about laser trimming fuse elements selected by the user through said input means from said laser trimming fuse element information extracted by said laser trimming fuse element information extraction means.

11. The semiconductor circuit logical check apparatus as claimed in claim 3, further comprising input means for inputting instructions from a user, wherein said logic simulation executing means performs logic simulation on a portion selected by the user through said input means from said models of said semiconductor circuit including said error bit memory cell array models.

12. The semiconductor circuit logical check apparatus as claimed in claim 11, wherein said output means displays on a screen laser trimming fuse elements associated with laser trimming operation error and signal lines connected to said laser trimming fuse elements in a manner distinguishable from the remaining elements.

13. The semiconductor circuit logical check apparatus as claimed in claim 10, wherein said output means displays on a screen laser trimming fuse elements associated with laser trimming operation error and signal lines connected to said laser trimming fuse elements in a manner distinguishable from the remaining elements.

14. The semiconductor circuit logical check apparatus as claimed in claim 1, further comprising input means for inputting instructions from a user, wherein said logic simulation executing means performs logic simulation on a portion selected by the user through said input means from said models of said semiconductor circuit including said error bit memory cell array models.

15. The semiconductor circuit logical check apparatus as claimed in claim 14, wherein said output means displays on a screen laser trimming fuse elements associated with laser trimming operation error and signal lines connected to said laser trimming fuse elements in a manner distinguishable from the remaining elements.

16. The semiconductor circuit logical check apparatus as claimed in claim 1, wherein said output means displays on a screen laser trimming fuse elements associated with laser trimming operation error and signal lines connected to said laser trimming fuse elements in a manner distinguishable from the remaining elements.

17. A semiconductor circuit logical check method for performing a logical check of a semiconductor circuit including laser trimming fuse elements and a memory cell array, said semiconductor circuit logical check method comprising:

extracting information about said laser trimming fuse elements from a layout pattern data of said semiconductor circuit and a logic-circuit diagram data of said semiconductor circuit;

generating a laser trimming operation command sequence indicating that one or more of said laser trimming fuse elements are broken in said semiconductor circuit on the basis of said laser trimming fuse element information extracted;

generating, from memory cell array models associated with said memory cell array, error bit memory cell array models representing that an error bit is included in said memory cell array;

executing logic simulation on models of said semiconductor circuit including said error bit memory cell array models on the basis of said laser trimming operation command sequence; and displaying results of said logic simulation.

18. A computer readable storage medium having a program causing a computer to execute the steps of:

extracting information about laser trimming fuse elements from a layout pattern data of a semiconductor circuit and a logic-circuit diagram data of said semiconductor circuit, said semiconductor circuit including said laser trimming fuse elements and a memory cell array;

generating a laser trimming operation command sequence indicating that one or more of said laser trimming fuse elements are broken in said semiconductor circuit on the basis of said laser trimming fuse element information extracted;

generating, from memory cell array models associated with said memory cell array, error bit memory cell array models representing that an error bit is included in said memory cell array;

executing logic simulation on models of said semiconductor circuit including said error bit memory cell array models on the basis of said laser trimming operation command sequence; and displaying results of said logic simulation.

* * * * *

UNITED STATES PATENT AND TRADEMARK OFFICE
CERTIFICATE OF CORRECTION

PATENT NO. : 5,828,673
DATED : October 27, 1998
INVENTOR(S) : Mikawa et al.

It is certified that error appears in the above-identified patent and that said Letters Patent is hereby corrected as shown below:

Column 10, Line 46, after "and" insert --a--;

Column 12, Line 12, change "3" to --10--.

Signed and Sealed this

Ninth Day of March, 1999

Attest:

Q. TODD DICKINSON

*Attesting Officer*　　*Acting Commissioner of Patents and Trademarks*